US009689898B2

(12) United States Patent
Podzemny et al.

(10) Patent No.: US 9,689,898 B2
(45) Date of Patent: Jun. 27, 2017

(54) MEDIUM OR HIGH VOLTAGE ARRANGEMENT WITH CABLE CONNECTION TERMINAL

(71) Applicant: ABB TECHNOLOGY AG, Zürich (CH)

(72) Inventors: Jaromir Podzemny, Brno (CZ); Radek Javora, Brno (CZ)

(73) Assignee: ABB Schweiz AG, Baden (CH)

( * ) Notice: Subject to any disclaimer, the term of this patent is extended or adjusted under 35 U.S.C. 154(b) by 190 days.

(21) Appl. No.: 14/616,163

(22) Filed: Feb. 6, 2015

(65) Prior Publication Data

US 2015/0153391 A1  Jun. 4, 2015

Related U.S. Application Data

(63) Continuation of application No. PCT/EP2013/002278, filed on Jul. 31, 2013.

(30) Foreign Application Priority Data

Aug. 6, 2012 (EP) ..................... 12005696

(51) Int. Cl.
*G01R 19/00* (2006.01)
*G01R 1/30* (2006.01)
(Continued)

(52) U.S. Cl.
CPC .................. *G01R 1/30* (2013.01); *G01R 1/18* (2013.01); *G01R 15/04* (2013.01); *G01R 19/00* (2013.01); *H02G 5/066* (2013.01)

(58) Field of Classification Search
CPC combination set(s) only.
See application file for complete search history.

(56) References Cited

U.S. PATENT DOCUMENTS

| 2,944,198 A | 7/1960 | Louys et al. |
| 3,835,353 A * | 9/1974 | Hermstein ............. G01R 15/16 361/303 |

(Continued)

FOREIGN PATENT DOCUMENTS

| CH | EP 0510427 A2 * 10/1992 ............. G01R 15/04 |
| CN | 2689243 Y   3/2005 |

(Continued)

OTHER PUBLICATIONS

International Search Report (PCT/ISA/220 and PCT/ISA/210) mailed on Jan. 21, 2014, by the European Patent Office as the International Searching Authority for International Application No. PCT/EP2013/002278.

(Continued)

*Primary Examiner* — Clayton E Laballe
*Assistant Examiner* — Jas Sanghera
(74) *Attorney, Agent, or Firm* — Taft Stettinius & Hollister LLP

(57) ABSTRACT

A medium or high voltage arrangement with a cable connection terminal and a voltage sensor is disclosed, wherein the voltage sensor has a resistive voltage divider and shielding electrodes. In order to enhance the accuracy of voltage measurement at medium or high voltage pole parts, the voltage sensor can be applied as a voltage sensor module, which can be integrated in a further cable connection terminal, and the shielding electrodes can be an integral part of the voltage sensor module or an integral part of an insulating housing part of the further cable connection terminal.

20 Claims, 3 Drawing Sheets

(51) Int. Cl.
*G01R 1/18* (2006.01)
*G01R 15/04* (2006.01)
*H02G 5/06* (2006.01)

(56) References Cited

U.S. PATENT DOCUMENTS

| | | | |
|---|---|---|---|
| 5,408,236 A | 4/1995 | Freiheit-Jensen et al. | |
| 5,796,296 A * | 8/1998 | Krzentz | G05F 3/247 327/530 |
| 5,883,508 A | 3/1999 | Ermisch et al. | |
| 2010/0253366 A1 | 10/2010 | Deibele et al. | |
| 2012/0127622 A1 | 5/2012 | Kajino et al. | |

FOREIGN PATENT DOCUMENTS

| | | | |
|---|---|---|---|
| DE | 1 516 244 A1 | 5/1969 | |
| DE | 195 08 582 A1 | 9/1996 | |
| DE | 198 41 164 A1 | 3/2000 | |
| DE | 198 55 528 A1 | 6/2000 | |
| DE | 103 44 165 A1 | 4/2005 | |
| DE | 10344165 A1 * | 4/2005 | G01R 15/04 |
| EP | 0 510 427 A2 | 10/1992 | |
| EP | 0 678 956 A1 | 10/1995 | |
| EP | 1 391 740 A2 | 2/2004 | |
| EP | 1 821 320 A1 | 8/2007 | |
| EP | 2 463 867 A1 | 6/2012 | |
| ES | 2 302 413 A1 | 7/2008 | |
| FR | 2 506 947 A1 | 12/1982 | |

OTHER PUBLICATIONS

Written Opinion (PCT/ISA/237) mailed on Jan. 21, 2014, by the European Patent Office as the International Searching Authority for International Application No. PCT/EP2013/002278.

PCT/ISA/206 mailed on Oct. 16, 2013, by the European Patent Office as the International Searching Authority for International Application No. PCT/EP2013/002278.

Extended European Search Report issued Jun. 7, 2013, by the European Patent Office in corresponding European Patent Application No. 12005696.5-1560.

Partial European Search Report issued Mar. 5, 2013, by the European Patent Office in corresponding European Patent Application No. 12005696.5-1560.

* cited by examiner

MEDIUM OR HIGH VOLTAGE ARRANGEMENT WITH CABLE CONNECTION TERMINAL

RELATED APPLICATION(S)

This application claims priority as a continuation application under 35 U.S.C. §120 to PCT/EP2013/002278, which was filed as an International Application on Jul. 31, 2013, designating the U.S., and which claims priority to European Application No. 12005696.5 filed on Aug. 6, 2012. The entire contents of these applications are hereby incorporated by reference in their entireties.

FIELD

The disclosure relates to a medium or high voltage arrangement with cable connection terminal and voltage sensor, wherein the voltage sensor can include a resistive voltage divider and shielding electrodes.

BACKGROUND INFORMATION

Devices are known which use resistive and/or capacitive dividers for voltage measurement and/or for protection purposes. Such devices, which operate at medium or at high voltage levels, may be exposed to a strong electric field which, being placed at very close vicinity, may influence measured quantities mainly in case of low-power outputs or introduce high dielectric stress on insulating material or on surface of such an equipment. Further influences can be observed, in case of outdoor installations, during rain or humid conditions, which may change electric field distribution, thus causing error to measured voltage level or causing corona on the surface of the devices or increased partial discharge level within the devices.

A voltage divider can include an insulating body, which can house high voltage impedance being connected to high voltage at one end and to low voltage impedance at the other end. Low-voltage impedance should be connected to the ground. Output of such impedance divider can be done by means of two wires and/or a cable.

Such measurement means can include higher susceptibility to parasitic capacitances and changes to the accuracy of measured voltage, which can provide inaccurate values for protection and/or measurement purposes.

The majority of known voltage sensors use special shielding electrodes, which can be designed for a particular application and for a voltage sensing size and principle use. A general impedance divider can have an insulating body accommodating impedance, which can be connected at one end to high voltage and at the other end to low-voltage impedance. Both high-voltage impedance and low-voltage impedance can form a voltage divider with given division ratio. The voltage divider can be grounded through ground connection. Output wires go through the cable, which can be shielded in order to minimize effects of external field on low-voltage signal going through the output wires. In order to reduce capacitive pick-up from external voltage sources or fields, shielding electrodes can be used around the divider.

Apart from external influences, shielding electrodes improve electric field distribution on surface of the insulating body or within that insulating body, thus enables higher dielectric withstanding of the device.

The use of shielding electrodes can minimize the sensitivity of the voltage divider towards external connections to a high-voltage terminal or to other surrounding devices connected to a high voltage potential.

SUMMARY

A medium or high voltage arrangement is disclosed, comprising: a cable connection terminal; and a voltage sensor, the voltage sensor having a resistive voltage divider and shielding electrodes, wherein the voltage sensor is applied as a voltage sensor module, which is integrated in a further cable connection terminal, and wherein the shielding electrodes are an integral part of the voltage sensor module or an integral part of an insulating housing part of the further cable connection terminal.

A medium or high voltage arrangement is disclosed for an isolator, a busbar, a bushing, a cable terminal, or a switchgear pole, the arrangement comprising: a cable connection terminal; a voltage sensor, the voltage sensor having a resistive voltage divider and shielding electrodes, wherein the voltage sensor is applied as a voltage sensor module, which is integrated in a further cable connection terminal, and wherein the shielding electrodes are an integral part of the voltage sensor module or an integral part of an insulating housing part of the further cable connection terminal; and wherein the shielding electrodes are applied at a low voltage side and a high voltage side of the resistive voltage divider with different conical shapes, such that an opening diameter of the shielding electrode at the low voltage side is greater than an opening diameter of the shielding electrode at the high voltage side.

BRIEF DESCRIPTION OF THE DRAWINGS

The disclosure is explained below with reference to the exemplary embodiments shown in the drawings. In the drawings.

DETAILED DESCRIPTION

Figure 1:
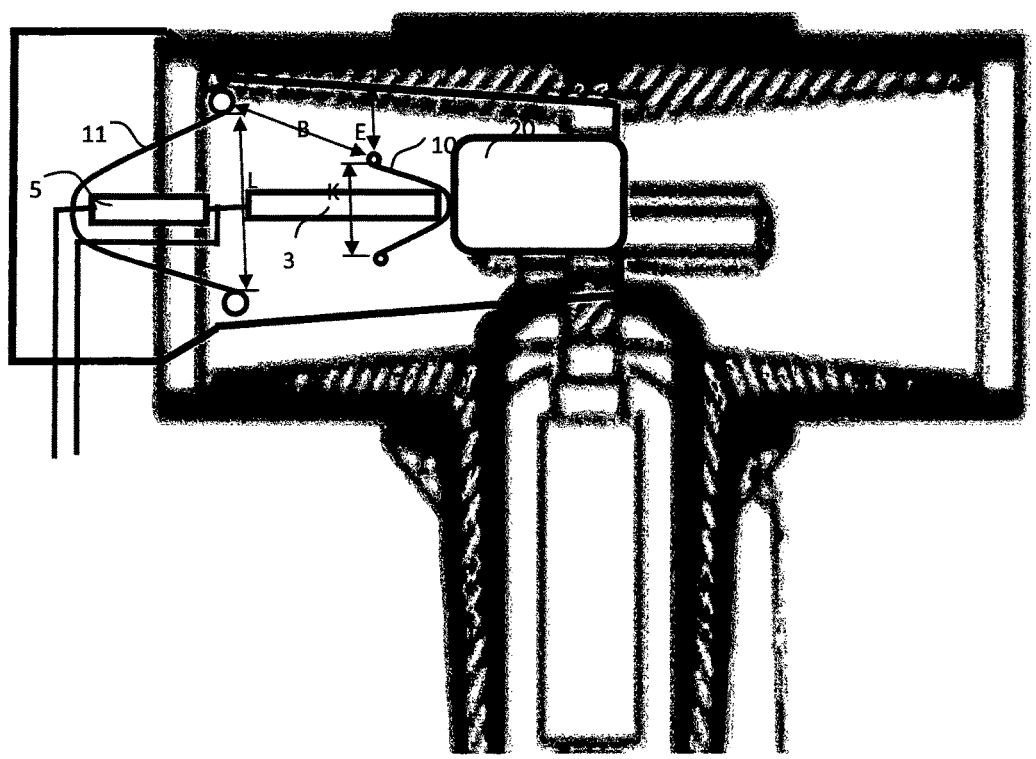
FIG. 1 shows an exemplary medium or high voltage arrangement with a cable connection terminal and voltage sensor.

In accordance with an exemplary embodiment of the disclosure, the accuracy of voltage measurement of medium and/or high voltage equipment can be enhanced.

In accordance with an exemplary embodiment of the disclosure, the voltage sensor can be applied as a voltage sensor module, which can be integrated in a further cable connection terminal, and the shielding electrodes can be an integral part of the voltage sensor module or an integral part of an insulating housing part of the terminal. In accordance with an exemplary embodiment, the voltage measurement can take place with higher accuracy.

In accordance with an exemplary embodiment, the shielding electrodes can be applied at the low voltage and high voltage side of a resistive voltage divider with different conical shape, such that the opening diameter of the shielding electrode at the low voltage side can be greater than the opening diameter of the shielding electrode at the high voltage side.

In accordance with an exemplary embodiment, the further cable connection terminal housing can have an opening with a conical shape at least at the inner surface, such that the cone diameter can increase from inside towards outside, and at least the inner surface of the cone can be covered with a conductive or semi-conductive layer, and the resistive voltage sensor divider can be located, such that the high-voltage side can be placed at the side with smaller inner diameter of the terminal opening, and the high voltage side can be placed at the larger diameter of the terminal housing opening. In accordance with this exemplary embodiment, the separate shielding elements can be obsolete, if the inner surface of the terminal opening can be covered with a conductive layer as a kind of integral shielding electrode. In accordance with an exemplary embodiment, for example, the electrode layer can also be located inside of the terminal housing or on an outer perimeter of the terminal housing.

In accordance with an exemplary embodiment, the further cable connection terminal can be applied adjacently to the cable terminal of the operating cable connection of the switchgear or other high or medium voltage arrangement, at the outgoing section side of for example a pole part.

In accordance with an exemplary embodiment, the voltage sensor module can be electrically connected to the further cable connection terminal.

In accordance with an exemplary embodiment, the voltage sensor can be applied as a voltage sensor module, which can be integrated in a further cable connection terminal, and the shielding electrodes can be an integral part of the voltage sensor module or an integral part of an insulating housing part of the terminal, such that instead of a resistive voltage divider, only low-voltage and high-voltage electrodes can be applied for voltage sensing purposes.

In accordance with an exemplary embodiment, the high-voltage shielding electrode and the low voltage shielding electrode can be arranged in relation to each other, such that they at least partly overlap one another, which can enhance the accuracy of the voltage measurement.

Figure 2:
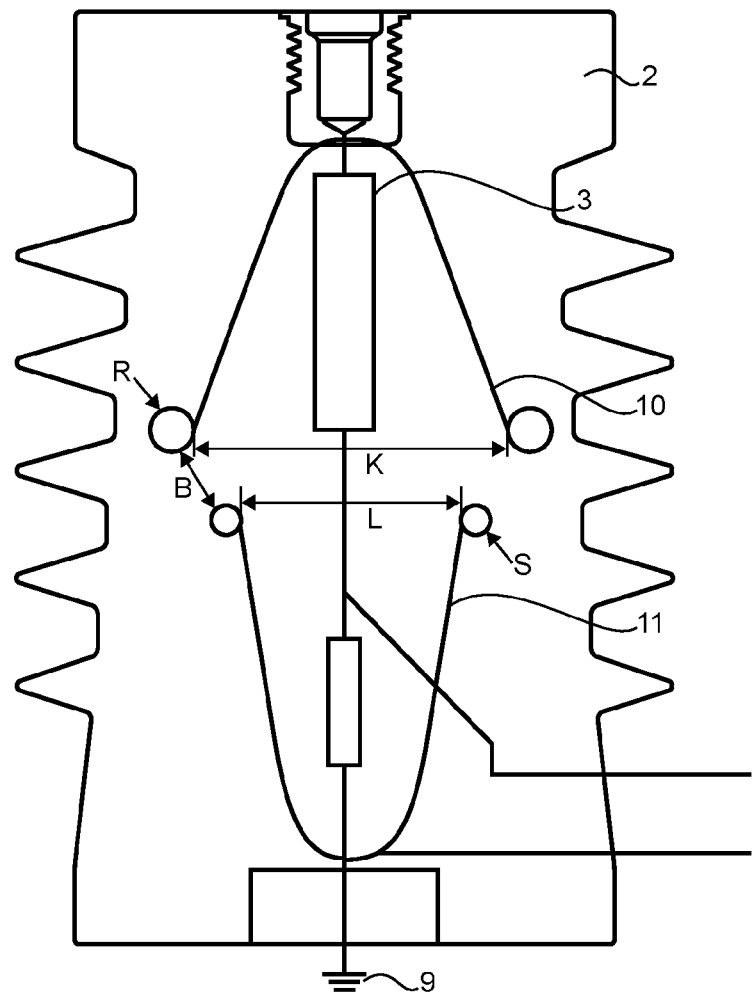
FIG. 2 shows an exemplary use of shielding electrodes where an upper shielding electrode has a conical shape which increases in distance from the resistive divider along an axis of the resistive divider.

In FIG. 2, an exemplary use of the shielding electrodes is disclosed where upper shielding electrode 10 has a conical shape, which can increase in distance from the resistive divider 3 along an axis of the resistive divider 3. This can be in line with a decrease of electric potential inside of the resistive divider 3. For example, due to the electrode 10 design, constant electric stress of an insulating material between electrode 10 and resistor 3 can be achieved. In accordance with an exemplary embodiment, the lower shielding electrode 11 can have conical shape, which can be located in an opposite direction from the upper electrode 10.

In accordance with an exemplary embodiment, for example, an improved dielectric and more accurate results for a stand-alone post insulator shape of voltage divider body 2 can be achieved when the lower shielding electrode 11 has the same or smaller (i.e., lower maximum) diameter L compared to a maximum diameter K of the upper electrode 10. In this case, for example, the design can be optimized in the way to shield as much as possible by the high voltage electrode 10 in order to minimize the effect of parasitic capacitances coming from the connection to a high voltage system.

In accordance with an exemplary embodiment, in case the application of resistive divider is not as stand-alone device, but integrated into other parts of the system, for example, the cable terminal, the lower shielding electrode 11 can be connected to the ground potential 9, and which can be larger (or bigger) than the upper electrode 10, which is connected to a high voltage potential. This configuration is shown in FIG. 1, with a high-voltage terminal 20.

In accordance with an exemplary embodiment, minimum phase error can be achieved by putting the smaller electrode S at least partly inside of the larger electrode R, and keeping a sufficient distance B in between the electrodes.

In accordance with an exemplary embodiment, the voltage arrangement does not use a resistive voltage divider. Instead, the voltage measuring means can consist of shielding electrodes without a resistive voltage divider, so that the voltage measuring means is only based on the shielding electrodes, which can form a kind of capacitive divider.

In accordance with an exemplary embodiment, the shielding electrodes in both cases, for example, capacitive measurement and resistive measurement can be obsolete, as separate shielding elements, if the inner surface of the terminal opening of the insulating body will be covered in the inner surface with a conductive material.

In accordance with an exemplary embodiment, the voltage sensor can be applied as a voltage sensor module, which can be integrated in the further cable connection terminal, and the shielding electrodes can be an integral part of the voltage sensor module or an integral part of an insulating housing part of the terminal. The shielding electrodes can be used for voltage indication for voltage detection purposes, and the voltage sensor module can be used for voltage measurement purposes.

In accordance with an exemplary embodiment, the high-voltage shielding electrode and the low voltage shielding electrode can be arranged in relation to each other in such, that they, from external point of view at least partly overlap.

In accordance with an exemplary embodiment, for the use of a high voltage electrode, the shape of the opening can be non-conical, for example, oval or parabolic.

In accordance with an exemplary embodiment, the end of each electrode 10, 11 can be rounded with a minimum radius of, for example, about 0.1 mm.

In accordance with an exemplary embodiment, the electrode can be made at least partly out of conductive material, capable of distributing electric potential.

In accordance with an exemplary embodiment, the minimum phase error can be achieved when division ration of capacitive resistances, created by shielding electrodes, match division ratio of the resistors R1 and R2 of the resistive divider.

Figure 3:
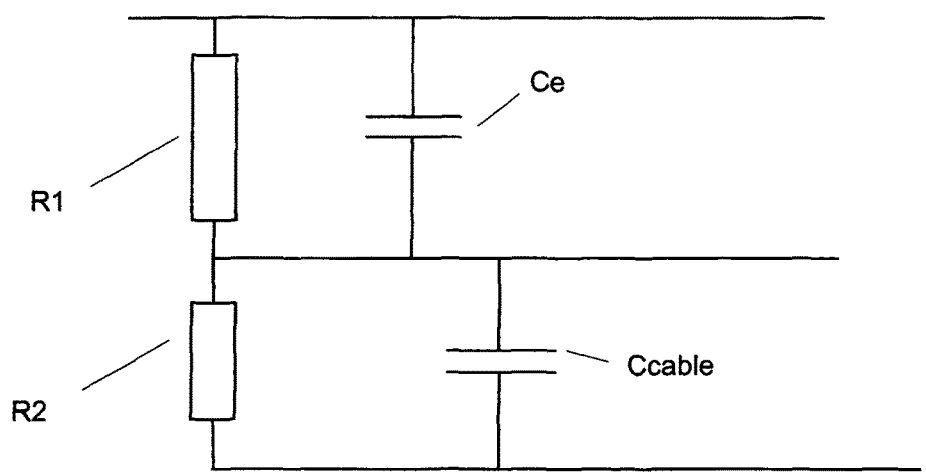
FIG. 3 shows an exemplary effect of shielding electrode on electrical parameters and output signal of impedance divider in accordance with an exemplary embodiment.

FIG. 3 describes the effect of shielding electrode on electrical parameters and output signal of impedance divider. The resistors R1 and R2, in case of resistive divider, can be selected in a way to obtain a specified division (transformation) ratio. In accordance with an exemplary embodiment, any capacitance introduced to the circuit cause phase error (displacement) of the output signal comparing to the measured (input) signal. Ce capacitance can be mainly affected by shape and position of the shielding electrodes (if used). Ccable capacitance can be mainly caused by cable capacitance. In case, the division ratio of reactances caused by capacitances Ce and Ccable match the division ratio of the resistors R1 and R2, minimum phase error can be achieved.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A medium or high voltage arrangement, comprising:
a cable connection terminal; and
a voltage sensor, the voltage sensor having a resistive voltage divider and shielding electrodes, wherein the voltage sensor is applied as a voltage sensor module, which is integrated in a further cable connection terminal, and wherein the shielding electrodes are an integral part of the voltage sensor module or an integral part of an insulating housing part of the further cable connection terminal.

2. The medium or high voltage arrangement according to claim 1, wherein the shielding electrodes are applied at a low voltage side and a high voltage side of the resistive voltage divider with different conical shapes, such that an opening diameter of the shielding electrode at the low voltage side is greater than an opening diameter of the shielding electrode at the high voltage side.

3. The medium or high voltage arrangement according to claim 2, wherein the further cable connection terminal housing has an opening with a conical shape at least at the inner surface, such that a cone diameter increases from inside towards an outside of the further cable connection terminal housing.

4. The medium or high voltage arrangement according to claim 3, wherein at least the inner surface of the cone is covered with a conductive layer, and the resistive voltage sensor divider is located such that the high voltage side is placed at the side with a smaller inner diameter of the terminal opening, and the low voltage side is placed at a larger diameter of the terminal housing opening.

5. The medium or high voltage arrangement according to claim 4, comprising:
a high voltage electrode, and wherein a shape of the opening of the further cable connection terminal is non-conical shape.

6. The medium or high voltage arrangement according to claim 5, wherein an end of each of the shielding electrodes is rounded with minimum radius of 0.1 mm.

7. The medium or high voltage arrangement according to claim 6, wherein each of the shielding electrodes is made at least partly out of conductive material, capable of distributing electric potential.

8. The medium or high voltage arrangement according to claim 4, comprising:
a high voltage electrode, and wherein a shape of the opening of the further cable connection terminal is an oval or a parabolic shape.

9. The medium or high voltage arrangement according to claim 1, wherein the further cable connection terminal is applied adjacently to a cable terminal of an operating cable connection of a busbar or an isolator or a switchgear, at the outgoing section side of the busbar or an isolator, or a switchgear pole.

10. The medium or high voltage arrangement according to claim 1, wherein the voltage sensor module is electrically connected to the further cable connection terminal.

11. The medium or high voltage arrangement according to claim 1, wherein instead of a resistive voltage divider, only low-voltage and high-voltage electrodes are applied for voltage sensing purpose.

12. The medium or high voltage arrangement according to claim 1, wherein shielding electrodes are used for voltage detection and the voltage sensor module is used for voltage measurement.

13. The medium or high voltage arrangement according to claim 1, wherein the shielding electrodes comprise a high-voltage shielding electrode and a low voltage shielding electrode, and the high-voltage shielding electrode and the low voltage shielding electrode are arranged in relation to each other to at least partly overlap one another.

14. The medium or high voltage arrangement according to claim 1, wherein a minimum phase error is achieved when a division ratio of capacitive resistances, created by the shielding electrodes, matches a division ratio of resistors of the resistive voltage divider.

15. The medium or high voltage arrangement according to claim 1, wherein the medium or high voltage arrangement is an isolator, a busbar, a bushing, a cable terminal, or a switchgear pole.

16. A medium or high voltage arrangement for an isolator, a busbar, a bushing, a cable terminal, or a switchgear pole, the arrangement comprising:
a cable connection terminal;
a voltage sensor, the voltage sensor having a resistive voltage divider and shielding electrodes, wherein the voltage sensor is applied as a voltage sensor module, which is integrated in a further cable connection terminal, and wherein the shielding electrodes are an integral part of the voltage sensor module or an integral part of an insulating housing part of the further cable connection terminal; and
wherein the shielding electrodes are applied at a low voltage side and a high voltage side of the resistive voltage divider with different conical shapes, such that an opening diameter of the shielding electrode at the low voltage side is greater than an opening diameter of the shielding electrode at the high voltage side.

17. The medium or high voltage arrangement according to claim 16, wherein the further cable connection terminal housing has an opening with a conical shape at least at the inner surface, such that a cone diameter increases from inside towards an outside of the further cable connection terminal housing; and wherein at least the inner surface of the cone is covered with a conductive layer, and the resistive voltage sensor divider is located such that the high voltage side is placed at the side with a smaller inner diameter of the terminal opening, and the low voltage side is placed at a larger diameter of the terminal housing opening.

18. The medium or high voltage arrangement according to claim 17, comprising:
a high voltage electrode, and wherein a shape of the opening of the further cable connection terminal is non-conical shape; and
wherein an end of each of the shielding electrodes is rounded with minimum radius of 0.1 mm.

19. The medium or high voltage arrangement according to claim 18, wherein each of the shielding electrodes is made at least partly out of conductive material, capable of distributing electric potential.

20. The medium or high voltage arrangement according to claim 17, comprising:
a high voltage electrode, and wherein a shape of the opening of the further cable connection terminal is an oval or a parabolic shape.

* * * * *